United States Patent [19]

Chen

[11] Patent Number: 5,628,922

[45] Date of Patent: May 13, 1997

[54] ELECTRICAL FLAME-OFF WAND

[75] Inventor: Jeng-Cheng A. Chen, Chung-Li, Taiwan

[73] Assignee: Motorola, Inc., Schaumburg, Ill.

[21] Appl. No.: 502,794

[22] Filed: Jul. 14, 1995

[51] Int. Cl.$^6$ ................................ B23K 9/00
[52] U.S. Cl. ................................ 219/56.21
[58] Field of Search ............ 219/56.21, 56.22, 219/137 R, 69.17

[56] References Cited

U.S. PATENT DOCUMENTS

| | | | |
|---|---|---|---|
| 3,826,000 | 7/1974 | Rocher et al. | 219/137 R |
| 3,950,631 | 4/1976 | Schmidt et al. | 219/69.17 |
| 4,594,493 | 6/1986 | Harrah et al. | 219/56.21 |
| 4,999,472 | 3/1991 | Neinast et al. | 219/56.21 |
| 5,110,032 | 5/1992 | Akiyama et al. | 219/56.21 |
| 5,170,928 | 12/1992 | Farassat | 219/56.21 |

FOREIGN PATENT DOCUMENTS 2086297  5/1982  United Kingdom ......... 219/56.21

*Primary Examiner*—Clifford C. Shaw
*Attorney, Agent, or Firm*—Robert D. Atkins

[57] ABSTRACT

A electrical flame-off (EFO) wand 200 for emitting an electrical discharge to form a length of bonding wire into a ball comprising a stainless steel tube mounting section 305 for mounting, a platinum rod electrode 315 inserted partially into the tube 305 and secured with electrically conductive epoxy 310. The dimensions of EFO wand 200 allows the capillary 110 to be positioned close to the die-lead frame assembly, improving the productivity of the bonding process and providing economical, good quality and more reliable wire bonding.

5 Claims, 2 Drawing Sheets

ELECTRICAL FLAME-OFF WAND

FIELD OF THE INVENTION

The invention relates in general to forming a ball at the tip of wire in semiconductor integrated circuit wire bonding, and in particular to electrical flame-off wands for forming the ball at the tip of wire.

BACKGROUND OF THE INVENTION

In semiconductor integrated circuit packaging, the process of electrically coupling a length of wire to a bond pad of a semiconductor die mounted on a lead frame to a lead of the lead frame is commonly known as wire bonding. For each connection between die and lead frame two bonds are required. A ball bond bonds one end of a length of wire to the die, and a stitch bond bonds the length of wire to a lead of the lead frame. Conventionally, the ball bond entails forming a ball on one end of a spool of wire, typically gold wire, prior to bonding the ball to a bond pad on a semiconductor integrated circuit using non-thermo compression, thermo compression or ultrasonic thermo compression. After the ball bond, a measured length of wire is provided from the spool of wire before the stitch bond is formed on a lead of the lead frame. The stitch bond also severs the length of wire from the spool, thereby freeing the end of the spool of wire on which a ball for the next connection is subsequently formed.

Bonding wire to the die and the lead frame is accomplished using a bond head having a capillary with a hardened tip, through which the wire from the spool is threaded. The bond head moves vertically along the z-axis above the die-lead frame assembly. The die-lead frame assembly is mounted on an x-y table which moves along the x and y axis to align the bonding locations on the die-lead frame assembly below the bond head. The movement of the bond head and the x-y table are co-ordinated and controlled manually or by a computer program during the bonding process.

Conventionally, the ball on the end of the spool of wire is formed by placing what is commonly known as an electrical flame-off (EFO) wand a predetermined distance from the end of the spool of wire. An electrical arc is then emitted between the end of the spool of wire and the EFO wand, forming a ball on the end of the spool of bonding wire. By varying the intensity and the duration of the electrical arc, the size of the ball that is formed can be adjusted to specific dimensions. To apply the electrical arc, a high voltage circuit generates a large potential difference between two terminals. One terminal is coupled to the; spool of wire, such that the wire forms an electrode, and the other terminal is connected to the EFO wand forming another electrode.

A conventional EFO wand is a hockey stick shaped stainless steel rod, the lower portion of which is positioned between the bond head and the die-lead frame assembly when forming a ball. Due to the size of the lower portion of the conventional EFO wand, and consequently the large clearance required between the bond head and the die-lead frame assembly, several disadvantages occur. A first disadvantage is the bond head must travel a long distance to the die which takes a significant period of time. Although the duration of one bond may not be significant, it should be noted that integrated circuits today have pin outs numbering in the hundreds. Hence, when viewing the duration of one bond from this perspective it becomes apparent that a minor change in the duration for one bond can have a considerable impact on the productivity of the wire bond process. A second disadvantage is the wide process variation in ball formation which affects the reliability of the ball bonds that are subsequently formed. A third disadvantage is the economic impact of the relatively shod life and high cost of replacement of the conventional EFO wand.

Hence, there exists a need for an EFO wand that is more economical to use in the wire bonding process, reduces process variation and improves the productivity of the wire bonding process.

SUMMARY OF THE INVENTION

In carrying out the objects of the present invention in one form, there is provided an electrical flame-off (EFO) wand comprising: a mounting section composed of a first rigid material; an electrode coupled to the mounting section for emitting an electrical arc, the electrode composed of a second rigid material, the second rigid material different than the first.

DETAILED DESCRIPTION OF THE INVENTION

Figure 1:
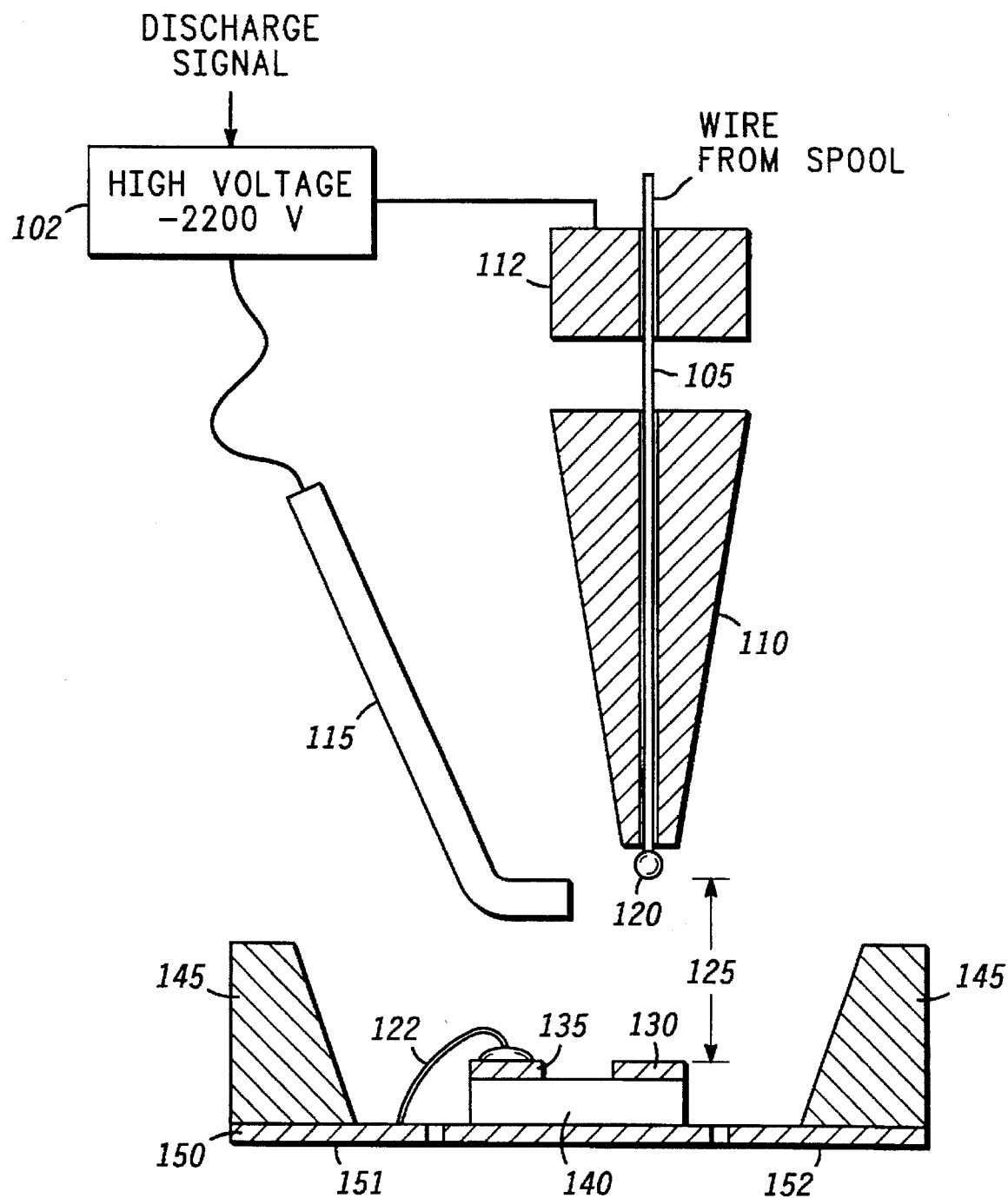
FIG. 1 illustrates wire bonding apparatus using a prior art electrical flame off wand.

FIG. 1 illustrates wire bonding apparatus using a prior art electrical flame-off (EFO) wand 115, bonding wire 105 fed through wire clamper 112 and capillary 110 having a ball 120 formed at the narrow end of the capillary 110, lead frame 150 having leads 151 and 152, a semiconductor integrated circuit or die 140 mounted on the lead frame 150 forming a die-lead frame assembly, bond pads 130 and 135 on the die 140, a wire 122 bonded to the pad 135 and tile lead 151, lead frame holder 145 for securing the die-lead frame assembly during wire bonding, and an electrical discharge generator 102 coupled to the wire clamper 112 and the EFO wand 115 for generating an electrical discharge in response to receiving a discharge signal. The EFO wand 115 comprises a rigid length of stainless steel, shaped similar to a hockey stick having a long portion and a short portion. The long portion is for mounting, and the short portion for emitting an electrical discharge or arc. Typically, gold bonding wire is used in the bonding process. However, wire of other base metals such as aluminium can also be used provided the duration and intensity of the electrical discharge, as well as other bond settings are changed accordingly to provide high quality bonding. The bonding wire 105 is provided from a spool, not shown in FIG. 1. Typically, a predetermined tension is maintained on the bonding wire 105 as it is fed from the spool through the wire clamper 112. The wire clamper 112 provides electrical contact with the boding wire 105 as the bonding wire 105 feeds through the wire clamper 112 and to the capillary 110. The capillary 110, often referred to as a bonding tool, is mounted in a bond head assembly which includes the wire clamper 112. The bond head assembly moves in a vertical direction along the z-axis, hence moving the capillary 110 in the vertical direction. The ball 120 is formed when the capillary 110 is at a first upper position. The capillary 110 then moves to a second lower position and compresses the ball 120 at the narrow end of the capillary 110 against the pad 130 with a predetermined force. Thus, bonding the ball 120 to the pad 130. Due to the clearance required by conventional EFO wands 115, separation 125 between the first upper and second lower position is considerable. Subsequently, the capillary 110 moves to the next bond location at the lead 152, and bonds the bonding wire 105 to the lead 152. Typically, the capillary 110 is coupled to a transducer such as an ultrasonic transducer, which imparts a mechanical scrubbing action on the ball 120 when bonding the ball 120 to the pad, and when bonding the bonding wire 105 to the lead 152. In some instances, the capillary 110 may also be heated to improve the quality of the bonding. The wire 122 bonded to the pad 140 on the die 140 and the lead 151 of the lead frame 150, illustrates the result of the bonding process using the prior art apparatus in FIG. 1 which process will be described next.

After completing a bond on a lead of the lead frame 150, a predetermined length of the bonding wire 105 protrudes from the opening at the narrow end of the capillary 110. The EFO wand 115 is then located between the narrow end of the; capillary 110 and the die-lead frame assembly. Subsequently, the electrical discharge generator 102 causes an electrical discharge to be emitted between the EFO wand 115 and the protruding bonding wire 105 in response to receiving a discharge signal. The electrical discharge forms the predetermined length of bonding wire 105 into the ball 120. The electrical discharge signal may be initiated manually in a manual bonding process, or automatically in accordance with a stored computer program when computer controlled equipment are used in the bonding process. The intensity and duration of the electrical discharge or arc is controlled in accordance with predetermined settings of the electrical discharge generator 102. After forming the ball, the capillary 110 is moved towards the bond pad 130 until the capillary 110 compresses the ball 120 against the pad 130 of the die 140 bonding the ball 120 to the pad 130. This bond is commonly referred to as a ball bond. Typically, the die-lead frame assembly is heated during the bonding process. In addition, as explained above, an ultrasonic transducer may also be used to bond the ball 120 to the pad 130. After the ball bond, the capillary 110 is moved away from the die-lead frame assembly to the next bond location on the lead 152. The capillary 110 moves towards the lead 152 and compresses the bonding wire 105 threading out of the opening at the narrow end of the capillary 110 against the lead 152. A second bond or stitch bond is formed on lead 152, and at the same time the end of the bonding wire 105 leading to the spool is severed. This second bond is commonly referred to a stitch bond. The wire 122 serves to illustrate a completed connection between the pad 135 on the die 140 and the lead 151 of the lead frame 150, formed using a conventional EFO wand. The capillary 110 is then moved away from the die-lead frame assembly with the severed end of the bonding wire protruding from the opening at the narrow end of the capillary 100, and the apparatus is then ready for the next ball to be formed and the process continues as described above.

Conventionally, the lower portion of the EFO wand 115 is positioned between the narrow end of the capillary 110 and the die-lead frame assembly when emitting the electrical discharge. The lower portion of the conventional EFO wand 115 is relatively large. Consequently, separation 125 between the narrow end of the capillary 110 and the die-lead frame assembly must allow sufficient clearance to position the EFO wand 115 therebetween.

The large separation imposed by using the prior art EFO wand requires the capillary to travel a longer distance to a pad on a die, hence requiring a longer travel time. With integrated circuits today having a large number of pin outs, the travel time when multiplied by these large numbers become considerable, and adversely affects the productivity of the bonding process. Another disadvantage when using the prior art EFO wand is the wide process variation in ball formation, which adversely affects the reliability of the ball bonds that are formed. Yet, another disadvantage is the economic impact of the relatively short life and high cost of replacement of the conventional EFO wand.

Figure 2:
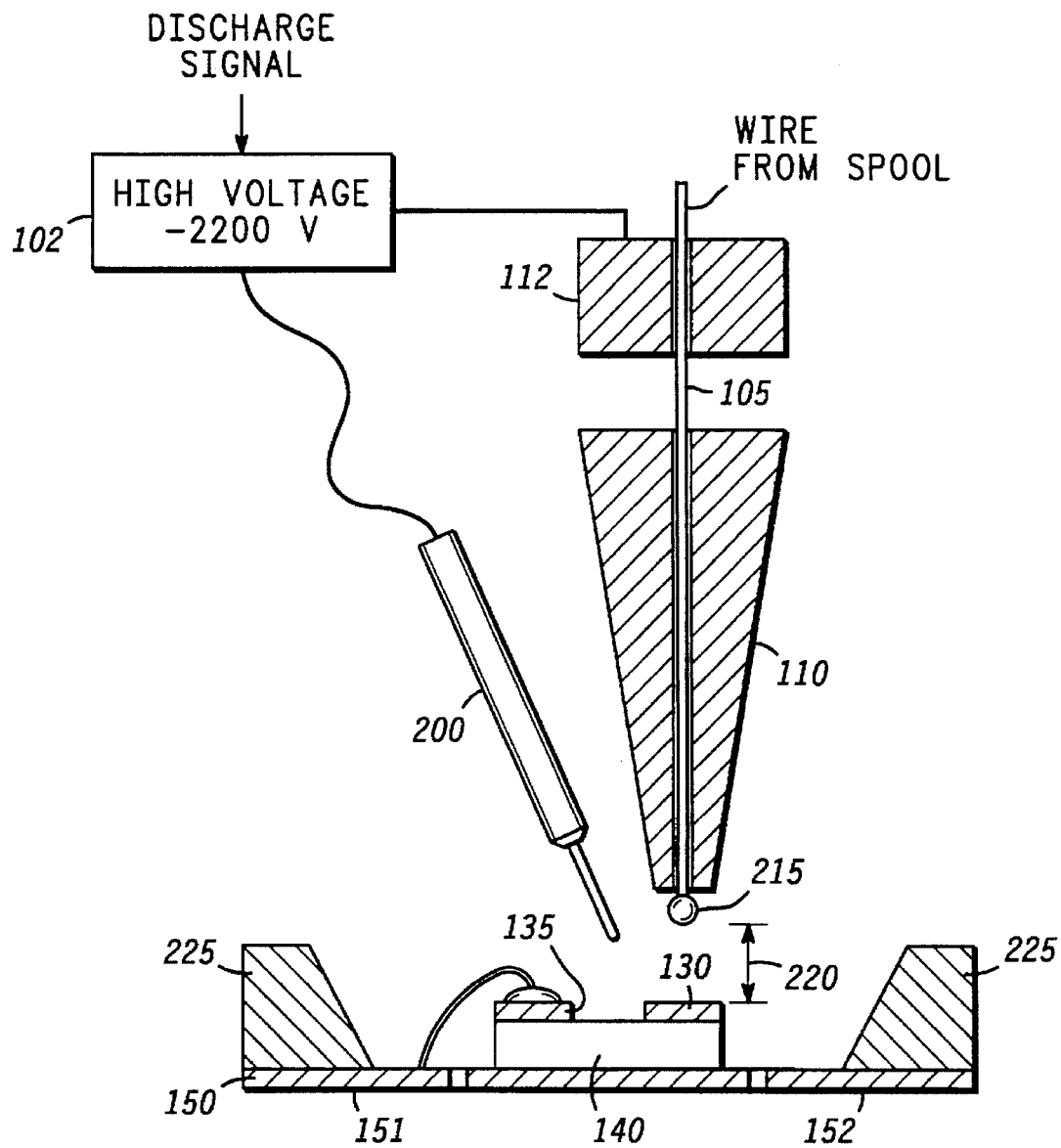
FIG. 2 illustrates wire bonding apparatus using an electrical flame off wand in accordance with a preferred embodiment of the present invention.

FIG. 2 illustrates wire bonding apparatus using an EFO wand 200 in accordance with a preferred embodiment of the present invention. The apparatus comprises the electrical flame-off (EFO) wand 200, bonding wire 105 fed through the wire clamper 112 and capillary 110 having a ball 215 formed at the end of boding wire 105 protruding from the narrow end of the capillary 110, lead frame 150 having leads 151 and 152, a semiconductor integrated circuit 140 mounted on the lead frame 150 forming a die-lead frame assembly, bond pads 130 and 135 on die 140, a wire 122 bonded to the pad 135 and the lead 151, lead frame holder 225 for securing the die-lead frame assembly during wire bonding, and an electrical discharge generator 102 coupled to the wire clamper 112 and the EFO wand 115 for generating an electrical discharge in response to receiving a discharge signal.

Figure 3:
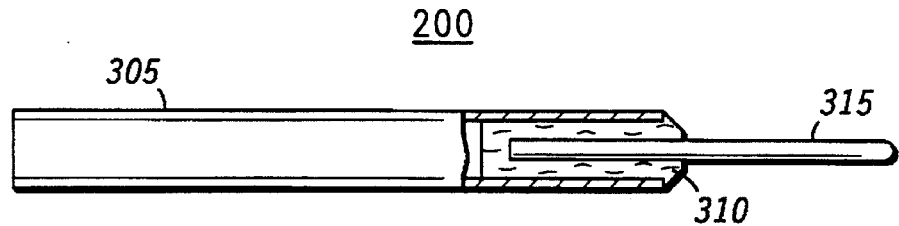
FIG. 3 illustrates the electrical flame off wand in FIG. 2 in accordance with the preferred embodiment of the present invention.

FIG. 3 illustrates the EFO wand 200 comprising a mounting section 305, an electrode 315 and epoxy 310. The mounting section 305 is for mounting the EFO wand 200 which is both rigid and electrically conductive. The electrode 315 is coupled to the mounting section for emitting an electrical discharge or arc to form a predetermined length of bonding wire 105 into the ball 215. Like the mounting section, the electrode 315 is also rigid and electrically conductive. In the preferred embodiment, the mounting section 305 is a stainless a tube and the electrode 315 is a platinum rod having a purity of 99.95%. The length and diameter of the tube is greater than the length and diameter of the rod, and the rod is partially inserted into the tube. In the preferred embodiment, at least two-fifths the length of the rod is inserted into the tube. The epoxy 310 is electrically conductive and secures the partially inserted rod to the tube. At the same time the epoxy 310 couples the rod and the tube electrically. The exposed end of the rod, that is the end that is not inserted into the tube, is rounded to a radius of one half the diameter of the rod. The diameter of the rod is also significantly smaller than the diameter of the ball 215; formed at the narrow end of the capillary 110. When securing the rod to the tube it is important to ensure that the rod and the tube are substantially aligned to a common lateral axis.

The wire bonding process as described in for the apparatus in FIG. 1 is unchanged when using the EFO wand 200. However, as the EFO wand 200 is smaller than that of the prior art, the EFO wand 200 is can be positioned adjacent to the capillary 110. Thus, the capillary 100 can be positioned substantially closer to the die lead frame assembly, and the height of the lead frame holder 225 reduced. Consequently, with the reduced separation 220 between the first upper position and the second lower position during the bonding process, the capillary 110 takes a shorter time to travel to the die-lead frame assembly when bonding the ball 215 to the pad 130 of the die 140, and when bonding the bonding wire 105 to the lead 152 of the lead frame 150. In addition, it has been found that the ball formed using the EFO wand 200 of the present invention exhibit less process variation than when using a conventional EFO wand. This results in more reliable bonding which in turn improves the reliability of a packaged integrated semiconductor chip.

An EFO wand fabricated in accordance with the present invention and used in a wire bonding process is positioned adjacent to a capillary unlike a conventional EFO wand which is located between the capillary and the die-lead frame assembly. This is achieved by the EFO wand having reduced dimensions, and not positioning the EFO wand between the capillary and the die-lead frame assembly during the bonding process. The EFO wand of the present invention, advantageously allows the capillary to be positioned closer to the die-lead frame assembly reducing the travel time of the capillary and improving the productivity of the bonding process. The EFO wand of the present invention also improves the quality of the balls that are formed, consequently increasing the reliability of the ball bonds formed thereof. In addition, as the EFO wand of the present invention is cheaper and has a longer life span than conventional EFO wands, the present invention advantageously provides an economic benefit.

Hence, the EFO wand of the present invention is economical to use in the wire bonding process, reduces process variation resulting in better reliability, and improves the productivity of the wire bonding process. In addition, the EFO of the present invention may be readily incorporated onto existing wire bonding equipment.

What is claimed is:

1. An apparatus coupled to an electrical discharge circuit for forming a predetermined length of bonding wire into a ball having predetermined dimensions at a first position, and for bonding the ball to a pad on a semiconductor die at a second position, the apparatus comprising:

a tube composed of a first electrically conductive rigid material having a first length and a first diameter for mounting;

a rod composed of a second electrically conductive rigid material having a second length and a second diameter, wherein the second electrically conductive material is different from the first, and wherein the second length is less than the first, and wherein the second diameter is less than the first, the rod inserted partially into the tube for emitting an electrical discharge; and epoxy composed of a third electrically conductive material for securing the partially inserted portion of the rod to the tube, and for electrically coupling the rod and the tube.

2. The rod of claim 1 wherein the second diameter is significantly smaller than the predetermined diameter of the ball.

3. The apparatus of claim 1 wherein the tube coupled to the rod and secured by epoxy form an electrical flame off (EFO) wand for coupling to the electrical discharge circuit, and for emitting the electrical discharge.

4. The apparatus in claim 3 further comprising, an electrical discharge generator having a first and second terminal, wherein the EFO wand is coupled to the first terminal, and wherein the predetermined length of wire is coupled to the second terminal, the electrical discharge generator causing the electrical discharge between the EFO wand and the predetermined length of wire in response to receiving a discharge signal, thereby forming the predetermined length of wire into the ball having predetermined dimensions at the first position.

5. An electrical flame off (EFO) wand for emitting an electrical discharge which forms a length of wire into a ball, the EFO wand comprising:

an elongate section compose of a first electrically conductive material for mounting;

a tip composed of a second electrically conductive material substantially aligned to a common lateral axis with the elongate section for emitting the electrical discharge; and a securing means for electrically securing the tip to the elongate section wherein the securing means comprises electrically conductive epoxy.

* * * * *